(12) United States Patent
Whitehead et al.

(10) Patent No.: US 11,742,854 B2
(45) Date of Patent: Aug. 29, 2023

(54) 3D ICON FOR USE WITH A SWITCH AND A METHOD OF MAKING THE 3D ICON

(71) Applicant: Inteva Products, LLC, Troy, MI (US)

(72) Inventors: David Whitehead, Rochester Hills, MI (US); Thomas Sybrandy, Washington, MI (US); Aidano Nascimento, Oakland Township, MI (US); Tyler Bame, Clawson, MI (US); David Kovac, Warren, MI (US)

(73) Assignee: INTEVA PRODUCTS, LLC, Troy, MI (US)

( * ) Notice: Subject to any disclaimer, the term of this patent is extended or adjusted under 35 U.S.C. 154(b) by 35 days.

(21) Appl. No.: 17/118,002

(22) Filed: Dec. 10, 2020

(65) Prior Publication Data

US 2021/0180775 A1    Jun. 17, 2021

Related U.S. Application Data

(60) Provisional application No. 62/947,861, filed on Dec. 13, 2019.

(51) Int. Cl.
*F21V 15/00* (2015.01)
*G06F 3/044* (2006.01)
(Continued)

(52) U.S. Cl.
CPC .............. *F21V 15/00* (2013.01); *G06F 3/044* (2013.01); *H03K 17/962* (2013.01); *B60Q 3/70* (2017.02);
(Continued)

(58) Field of Classification Search
CPC ........ H03K 2217/96078; H03K 2217/960755; H03K 17/962; H03K 2217/960785; F21Y 2115/00; F21Y 2115/10; G06F 3/00; B60Q 3/70; F21V 15/00; H01H 3/00; H01H 3/02; H01H 3/08; H01H 3/12; H01H 9/00; H01H 9/02; H01H 9/16; H01H 9/161; H01H 9/165; H01H 9/18; H01H 9/182; H01H 9/50; H01H 9/70; H01H 9/7006; H01H 9/7013; H01H 9/702; H01H 9/83;
(Continued)

(56) References Cited

U.S. PATENT DOCUMENTS 4,365,120 A * 12/1982 Pounds ................. H01H 13/83
                                              200/314
5,199,555 A *  4/1993 Hirano ................. H01H 13/14
                                              200/341
(Continued)

FOREIGN PATENT DOCUMENTS

DE       202004006598 U1 *  9/2005   ............. G06F 3/037

OTHER PUBLICATIONS

Notification of the First Notice to Make Rectification in Chinese for Application No. 202023017742.5 dated Jul. 5, 2021; 2 pages.

*Primary Examiner* — Anthony R Jimenez
(74) *Attorney, Agent, or Firm* — Cantor Colburn LLP

(57) ABSTRACT

An assembly including a three dimensional icon defined within an interior of the assembly; the assembly including a non-moveable switch; a device for illuminating the three dimensional icon, wherein illumination of the three dimensional icon by the device causes the three dimensional icon to be visible on an exterior surface of the assembly.

19 Claims, 3 Drawing Sheets

(51) Int. Cl.
*H03K 17/96* (2006.01)
*B60Q 3/70* (2017.01)
*F21Y 115/10* (2016.01)

(52) U.S. Cl.
CPC .............. *F21Y 2115/10* (2016.08); *H03K 2217/960755* (2013.01); *H03K 2217/960785* (2013.01)

(58) Field of Classification Search
CPC ....... H01H 2221/07; H01H 2221/0702; H01H 2221/074; H01H 2239/068; H01H 2219/00; H01H 2219/014; H01H 2219/01; H01H 2219/018; H01H 2219/028; H01H 2219/03; H01H 2219/032; H01H 2219/034; H01H 2219/036; H01H 2219/037; H01H 2219/039; H01H 2219/04; H01H 2219/046; H01H 2219/048; H01H 2219/052; H01H 2219/054; H01H 2219/058; H01H 9/181; H01H 9/185; H01H 13/50; H01H 13/52; H01H 2003/12

USPC ........................................................ 200/600
See application file for complete search history.

(56) References Cited

U.S. PATENT DOCUMENTS

| | | | | |
|---|---|---|---|---|
| 7,817,136 | B2* | 10/2010 | Shaft | G06F 3/03543 345/163 |
| 8,792,143 | B2* | 7/2014 | Ishida | H04N 1/00384 345/173 |
| 2002/0112942 | A1* | 8/2002 | Galmiche | H03K 17/962 200/600 |
| 2009/0026053 | A1* | 1/2009 | Lerenius | H01H 13/83 200/314 |
| 2009/0058118 | A1* | 3/2009 | Hein | B60K 35/00 200/310 |
| 2009/0189316 | A1* | 7/2009 | Chang | B29C 35/02 264/447 |
| 2014/0104746 | A1* | 4/2014 | Haag | H05K 3/30 361/280 |

* cited by examiner

3D ICON FOR USE WITH A SWITCH AND A METHOD OF MAKING THE 3D ICON

CROSS REFERENCE TO RELATED APPLICATIONS

This application claims the benefit of U.S. Provisional Patent Application Ser. No. 62/947,861 filed on Dec. 13, 2019, the contents of which are incorporated herein by reference thereto.

BACKGROUND

Exemplary embodiments of the present disclosure pertain to the art of control icons and more particularly, an icon for use with a non-moving switch and a method of making the icon.

Control icons are images an operator sees on pushbuttons that indicate what the function of that button is. Typically, these icons are very simplified two dimensional (2D) images, which are located on a moving switch (e.g., pushbutton, rocker or dial). Accordingly, it is desirable to provide a more aesthetically pleasing icon.

BRIEF DESCRIPTION

Disclosed is an assembly including a three dimensional icon defined within an interior of the assembly; the assembly including a non-moveable switch; a device for illuminating the three dimensional icon, wherein illumination of the three dimensional icon by the device causes the three dimensional icon to be visible on an exterior surface of the assembly.

In addition to one or more of the features described above, or as an alternative to any of the foregoing embodiments, the assembly further includes a polycarbonate substrate layer and the three dimensional icon is molded into the polycarbonate substrate layer.

In addition to one or more of the features described above, or as an alternative to any of the foregoing embodiments, the assembly further includes a layer of polyurethane applied to the polycarbonate layer.

In addition to one or more of the features described above, or as an alternative to any of the foregoing embodiments, the non-moveable switch is a capacitive sensor integrated with a printed circuit board.

In addition to one or more of the features described above, or as an alternative to any of the foregoing embodiments, the non-moveable switch is a printed touch sensor integrated into a flexible film located on a forward facing surface of the polycarbonate substrate layer that is disposed adjacent to the layer of polyurethane.

In addition to one or more of the features described above, or as an alternative to any of the foregoing embodiments, the flexible film is injection molded with the polycarbonate substrate layer.

In addition to one or more of the features described above, or as an alternative to any of the foregoing embodiments, the assembly is a portion of a vehicle interior.

In addition to one or more of the features described above, or as an alternative to any of the foregoing embodiments, the device is a light emitting diode (LED).

In addition to one or more of the features described above, or as an alternative to any of the foregoing embodiments, the assembly further includes a polycarbonate substrate layer and an icon sub-assembly inserted into an opening located in the polycarbonate substrate layer and a layer of polyurethane applied to the polycarbonate layer, wherein the icon sub-assembly includes the three dimensional icon and the device for illuminating the three dimensional icon.

In addition to one or more of the features described above, or as an alternative to any of the foregoing embodiments, the non-moveable switch is a sensor ring located about a periphery of the icon sub-assembly.

In addition to one or more of the features described above, or as an alternative to any of the foregoing embodiments, the icon sub-assembly has a frame that surrounds the device for illuminating.

In addition to one or more of the features described above, or as an alternative to any of the foregoing embodiments, the frame is formed from a polycarbonate material.

In addition to one or more of the features described above, or as an alternative to any of the foregoing embodiments, the frame is opaque.

In addition to one or more of the features described above, or as an alternative to any of the foregoing embodiments, the frame includes a flange portion that engages a back side of the polycarbonate substrate layer about a periphery of an opening in the polycarbonate substrate layer that the icon sub-assembly is inserted into.

In addition to one or more of the features described above, or as an alternative to any of the foregoing embodiments, the non-moveable switch is formed from a clear conductor that is located on a top of the icon sub-assembly.

In addition to one or more of the features described above, or as an alternative to any of the foregoing embodiments, a flange is located between end portions of the frame and the flange engages a forward facing surface of the polycarbonate substrate layer located adjacent to the layer of polyurethane.

In addition to one or more of the features described above, or as an alternative to any of the foregoing embodiments, the non-moveable switch is integrated with a printed circuit board and the device for illuminating is provided by side firing light emitting diodes (LEDS).

In addition to one or more of the features described above, or as an alternative to any of the foregoing embodiments, an area below features of the three dimensional icon is filled with a clear material.

In addition to one or more of the features described above, or as an alternative to any of the foregoing embodiments, the non-moveable switch is a capacitive touch pad located behind the three dimensional icon.

In addition to one or more of the features described above, or as an alternative to any of the foregoing embodiments, the three dimensional icon is a laser drawn three dimensional image within a volume of plastic located above the non-moveable switch.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Illustrated in the attached FIGS. are various embodiments of an illuminated icon and corresponding switch for the illuminated icon. For example, the icon may be one illustrative of a fan and the switch is a switch that turns the fan on and off.

In the disclosed embodiments, the touch point or switch does not move. As such and in one non-limiting embodiment, a capacitive sensor may be used for the switch. Thereafter, the icon or symbol for the control surface can be arranged to provide a three dimensional shape since the icon does not move.

In one embodiment of the present disclosure a three dimensional shape is molded in a back side of a substrate and the three dimensional appearance of the image can be enhanced with forward facing or side emitting light emitting diodes LEDs. Therefore and when an operator of the switch looks at the control surface the icon is three dimensional and thus has a more aesthetically pleasing appearance. In another non-limiting embodiment, the molded three dimensional shape can be backfilled with another clear material that has a different refractive index. This filled in portion can facilitate the use of a capacitive touch pad behind the icon since there is no longer an air gap above the capacitive touch pad.

In another non-limiting embodiment of the present disclosure a laser is used to draw a three dimensional image of the icon within the volume of plastic. This method may be referred to as sub-surface laser engraving. By focusing a laser on a very specific point in the three dimensional volume of plastic a void is created at that point in space and an image is created. This image, when illuminated appears as a three dimensional object.

Figure 1:
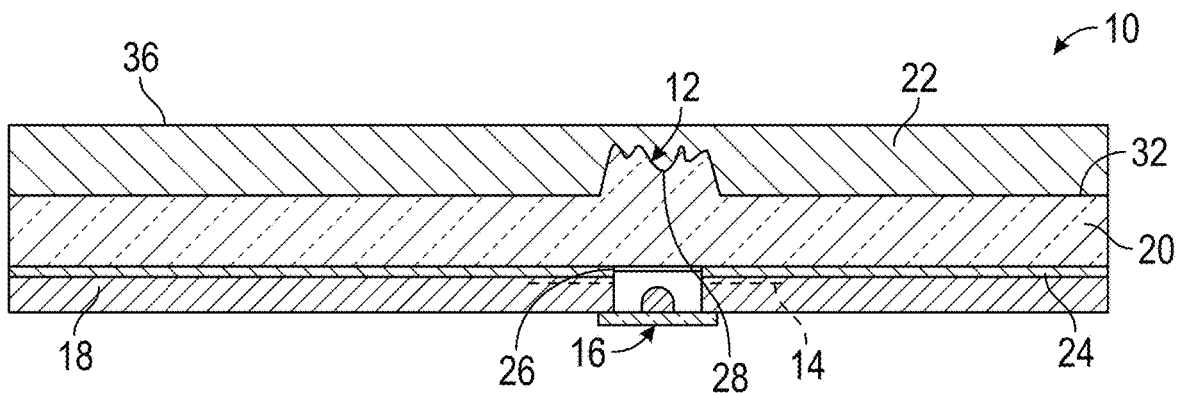
FIG. 1 is cross-sectional view of an illuminated icon and corresponding switch formed in accordance with an embodiment of the present disclosure.

Referring now to FIG. 1, as assembly 10 of a three dimensional icon 12, a corresponding non-moveable switch or sensor 14 and a means or device for illuminating 16 the three dimensional icon 12 is illustrated. As used herein, a non-moveable switch or sensor 14 may be referred to as a capacitive sensor or other equivalent device that when is placed in close proximity to an operator's finger a switch or circuit is closed without any components moving. In one non-limiting embodiment, the assembly 10 may be a portion of a vehicle interior such as instrument panel or console or center console or armrest of the vehicle. In the FIG. 1 embodiment, a printed circuit board (PCB) 18 is provided with the non-moveable switch or sensor 14 and the means or device for illuminating 16 the three dimensional icon 12. In one embodiment, the means or device for illuminating is a light emitting diode (LED).

In the FIG. 1 embodiment, the icon 12 is molded into a polycarbonate substrate layer 20 by for example, any suitable molding process such as injection molding, etc. Then, a clear layer of polyurethane 22 is applied to the polycarbonate layer 20. In order to prevent the printed circuit board 18 from being viewed through the layer of polyurethane 22 and the polycarbonate layer 20, an opaque masking layer 24 is located between the printed circuit board 18 and the polycarbonate layer 20. The opaque masking layer 24 is provided with an opening 26 so that light emitting from the means for illuminating 16 is directed to the icon 12. As illustrated, a back side of the icon 12 can be shaped with features 28 in order to create a shadowing effect within the icon 12 when it is illuminated by the means for illuminating 16. As such, a three dimensional icon will be viewable from an exterior surface or control surface 36 of the assembly 10 when it is illuminated by the means for illuminating 16. The features 28 of the three dimensional icon are defined or located within an interior of the assembly 10. In this embodiment, the non-moveable switch or sensor 14 (e.g., capacitive sensor or otherwise) is integrated with or integral with the printed circuit board 18.

Figure 2:
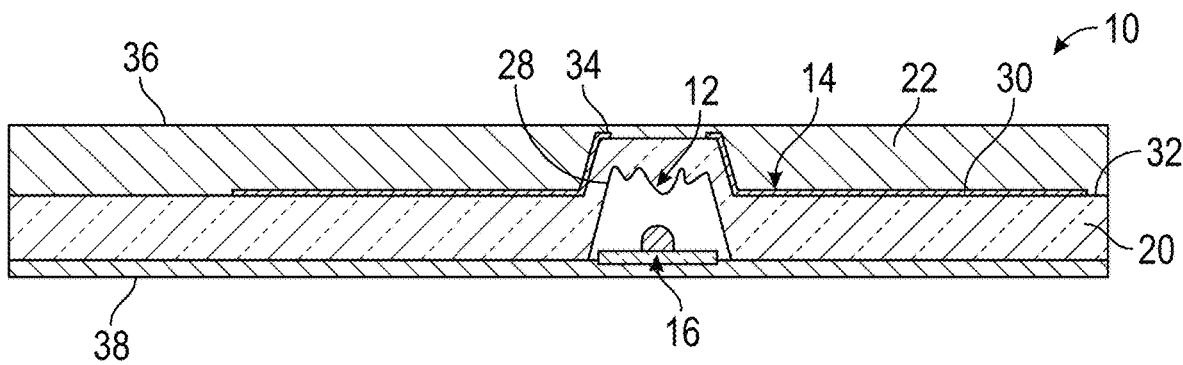
FIG. 2 is cross-sectional view of an illuminated icon and corresponding switch formed in accordance with an embodiment of the present disclosure.

Referring now to FIG. 2 another embodiment of the present disclosure is illustrated. In this embodiment, the non-moveable switch or sensor 14 is a printed touch sensor integrated into a flexible film 30 located on a forward facing surface 32 of the polycarbonate substrate layer 20 that is disposed adjacent to the polyurethane layer 22. In one embodiment, the flexible film 30 is a formed film with the necessary conductive traces. In this embodiment, the flexible film 30 has an opening 34 in order to allow for the three dimensional icon 12 to be viewed from the exterior surface 36 of the polyurethane layer 22. In this embodiment, the means for illuminating 16 is secured to a substrate layer 38. In one embodiment, the flexible film 30 is injection molded with the polycarbonate substrate layer 20.

Figure 3:
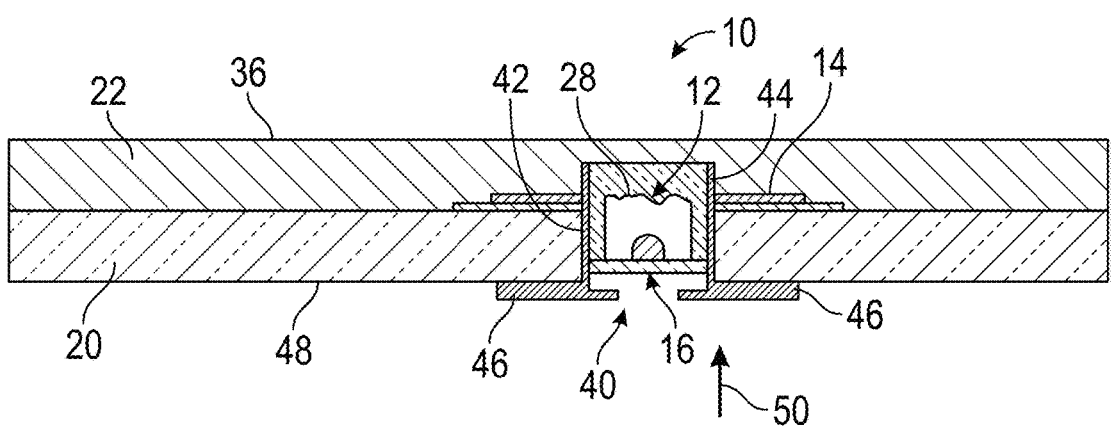
FIG. 3 is cross-sectional view of an illuminated icon and corresponding switch formed in accordance with an embodiment of the present disclosure.

Referring now to FIG. 3 another alternative embodiment of the present disclosure is illustrated. Here the assembly 10 comprises an icon sub-assembly 40 that is inserted into an opening or recess 42 located in the polycarbonate substrate layer 20 and then the clear layer of polyurethane 22 is applied to the polycarbonate layer 20. In this embodiment, the icon sub-assembly 40 includes the three dimensional icon 12 including the features 28 and the means for illuminating 16 (e.g., LED). In this embodiment, the non-moveable switch or sensor 14 is a sensor ring located about the periphery of the icon sub-assembly 40. In this embodiment and in order to prevent the possibility of a "halo effect" from the means for illuminating 16 the icon sub-assembly 40 has a frame 44 that surrounds the means for illuminating 16. The frame 44 may also be formed from a polycarbonate material. In order prevent this "halo effect" the frame 44 is formed out of an opaque material. In this embodiment, the frame 44 of the icon sub-assembly 40 also includes a flange portion 46 that engages a back side 48 of the polycarbonate substrate layer 20 about the periphery of opening 42 as the icon sub-assembly 40 is inserted into opening 42 in the direction of arrow 50. In this embodiment, the polycarbonate substrate layer 20 may be formed in the same color as the desired location or usage (e.g., same color as the interior trim into which the assembly 10 is incorporated). Similarly, the frame 44 of the icon sub-assembly 40 may be formed in the same color as the desired location or usage (e.g., same color as the interior trim into which the assembly 10 is incorporated).

Figure 4:
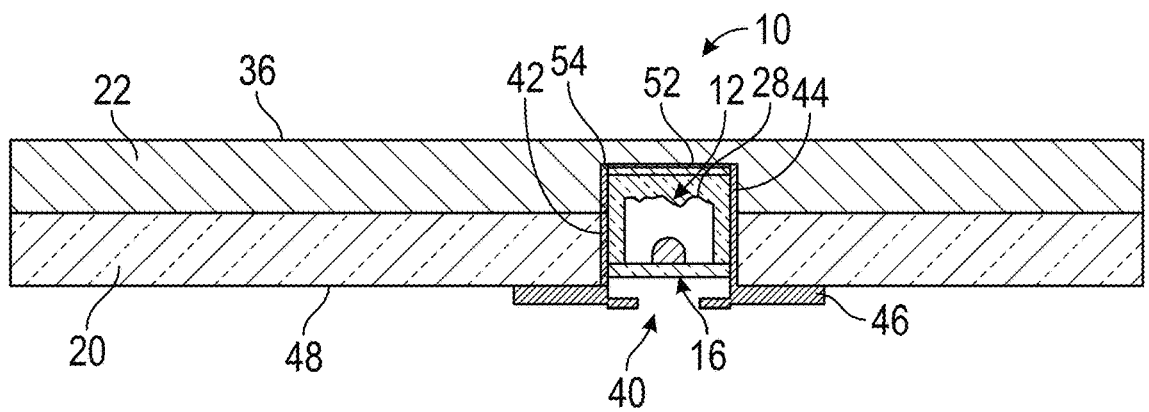
FIG. 4 is cross-sectional view of an illuminated icon and corresponding switch formed in accordance with yet another embodiment of the present disclosure.

Referring now to FIG. 4, another embodiment of the present disclosure is illustrated. The FIG. 4 embodiment is similar to the FIG. 3 embodiment however; the non-moveable switch or sensor 14 is formed from a clear conductor 52 that is located on a top 54 of the icon sub-assembly 40 as opposed to a sensor ring located about the periphery of the icon sub-assembly 40. The clear conductor 52 ensures that the three dimensional icon 12 is viewable from the surface 36.

Figure 5:
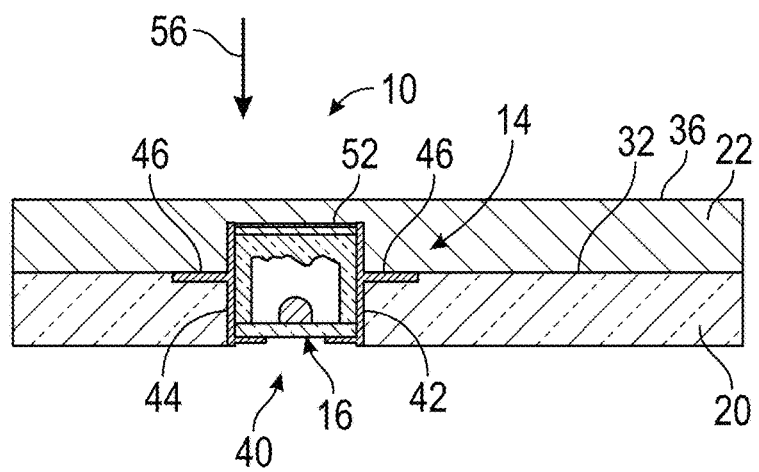
FIG. 5 is cross-sectional view of an illuminated icon and corresponding switch formed in accordance with yet another embodiment of the present disclosure.

Referring now to FIG. 5, another embodiment of the present disclosure is illustrated. The FIG. 5 embodiment is similar to the FIG. 4 embodiment however, the icon sub-assembly 40 is configured to be inserted through the forward facing surface 32 of the polycarbonate substrate layer 20 in the direction of arrow 56. In this embodiment, the flange 46 is located between opposite ends of the frame 44 and the flange 46 engages surface 32 once it is inserted into opening 42 in the direction of arrow 56. Similar to the FIG. 4 embodiment, the non-moveable switch or sensor 14 is formed from a clear conductor 52 that is located on a top 54 of the icon sub-assembly 40 as opposed to a sensor ring located about the periphery of the icon sub-assembly 40. The clear conductor 52 ensures that the three dimensional icon 12 is viewable from the surface 36.

Figure 6:
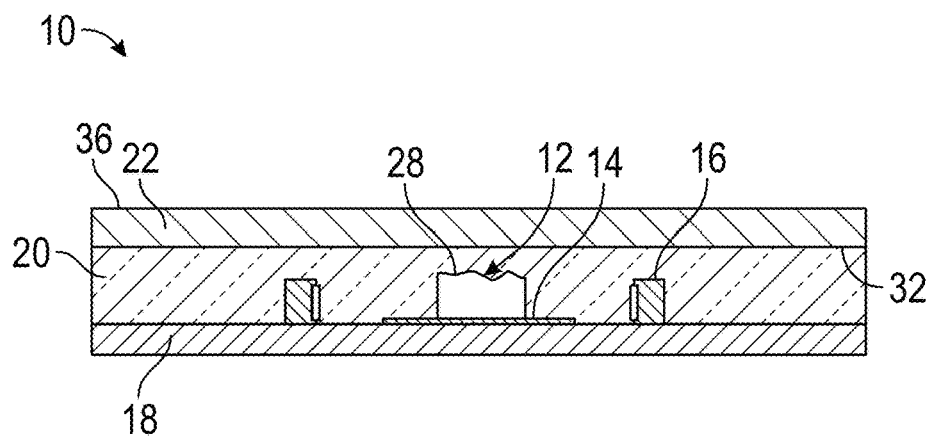
FIG. 6 is cross-sectional view of an illuminated icon and corresponding switch formed in accordance with yet another embodiment of the present disclosure.

Referring now to FIG. 6, yet another embodiment of the present disclosure is illustrated. As in the previous embodiments, the three dimensional icon 12 is molded into the polycarbonate substrate layer 20 by for example, any suitable molding process such as injection molding, etc. Then, a clear layer of polyurethane 22 is applied to the polycarbonate layer 20. In this embodiment, the non-moveable switch or sensor 14 is integrated with the printed circuit board 18 and the means for illuminating 16 is provided by side firing light emitting diodes (LEDS).

Figure 7:
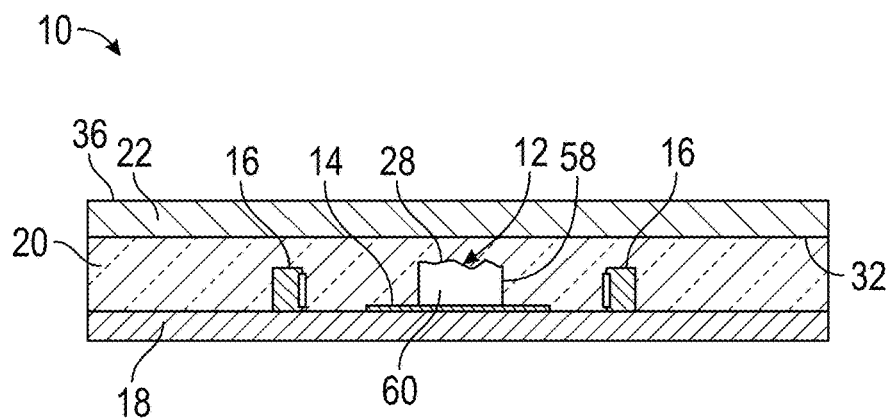
FIG. 7 is cross-sectional view of an illuminated icon and corresponding switch formed in accordance with yet another embodiment of the present disclosure.

Referring now to FIG. 7, another embodiment of the present disclosure is illustrated. This embodiment is similar to the FIG. 6 embodiment however and in this embodiment, an area 58 below the features 28 of the three dimensional icon is filled with a clear material 60. Non-limiting examples of the clear material 60 include epoxy, acrylic, plexiglass, Poly (methyl methacrylate) (PMMA), silicone, or other polycarbonates and equivalents thereof. This clear material will have a different refractive index than the polycarbonate layer 20. This filled in portion can facilitate the use of a capacitive touch pad behind the icon since there is no longer an air gap above the capacitive touch pad.

Figure 8:
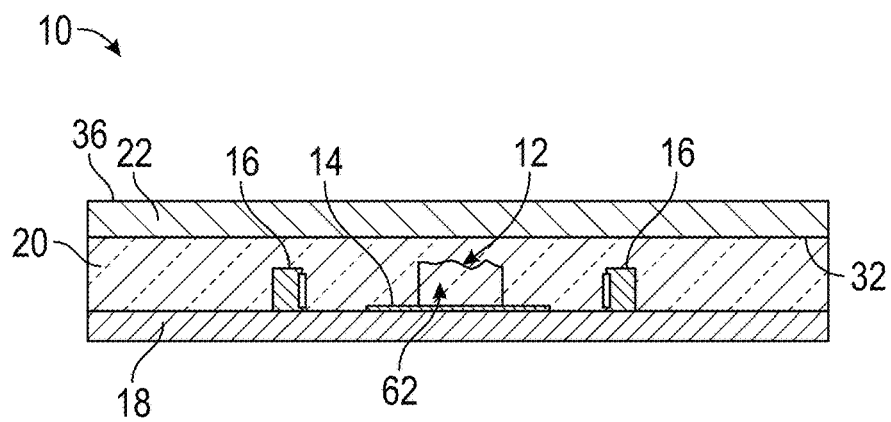
FIG. 8 is cross-sectional view of an illuminated icon and corresponding switch formed in accordance with yet another embodiment of the present disclosure.

In another non-limiting embodiment of the present disclosure and referring now to FIG. 8, a laser is used to draw a three dimensional image of the icon within a volume of plastic 62 located above the non-moveable switch or sensor (e.g., capacitive sensor) 14 is integrated with the printed circuit board 18 and the means for illuminating 16 is provided by side firing light emitting diodes (LEDS). The use of a laser to draw the three dimensional image may be referred to as sub-surface laser engraving wherein a laser is focused on a very specific point in the three dimensional volume of plastic 62 and a void is created at that point in space in order to define the three dimensional icon and/or an image is created. This image, when illuminated appears as a three dimensional object.

Figure 9:
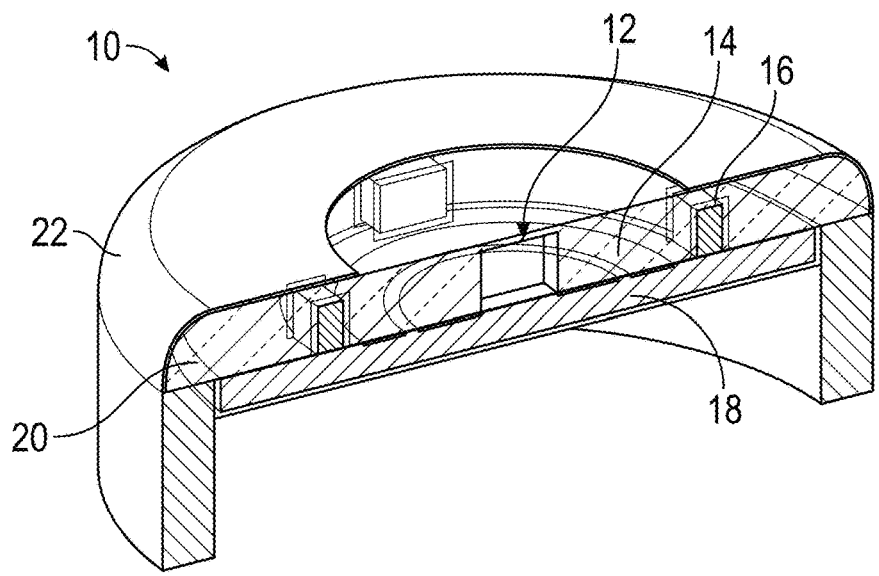
FIG. 9 is perspective view of an illuminated icon and corresponding switch formed in accordance with the present disclosure.

FIG. 9 is a partial perspective cross-sectional view of an assembly 10 contemplated for at least the embodiments illustrated in FIGS. 6-8.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An assembly, comprising:
    a polycarbonate substrate layer having a forward facing surface and a rearward facing surface opposite to the forward facing surface;
    a three dimensional icon defined within the polycarbonate substrate layer, the three dimensional icon being a three dimensional shape molded in the rearward facing surface of the polycarbonate substrate layer;
    a layer of polyurethane applied to the forward facing surface of the polycarbonate substrate layer;
    a non-moveable switch;
    a device for illuminating the three dimensional icon, wherein illumination of the three dimensional icon by the device causes the three dimensional icon to be visible on an exterior surface of the assembly.

2. The assembly as in claim 1, wherein the assembly is a portion of a vehicle interior.

3. The assembly as in claim 1, wherein the device is a light emitting diode (LED).

4. The assembly as in claim 1, wherein the non-moveable switch is a capacitive sensor integrated with a printed circuit board.

5. The assembly as in claim 1, wherein the three dimensional shape of the three dimensional icon is a laser drawn three dimensional image within the rearward facing surface of the polycarbonate substrate layer located above the non-moveable switch.

6. The assembly as in claim 1, wherein the non-moveable switch is integrated with a printed circuit board and the device for illuminating is provided by side firing light emitting diodes (LEDS).

7. The assembly as in claim 1, wherein the non-moveable switch is a printed touch sensor integrated into a flexible film located on the forward facing surface of the polycarbonate substrate layer that is disposed adjacent to the layer of polyurethane.

8. The assembly as in claim 7, wherein the flexible film is injection molded with the polycarbonate substrate layer.

9. The assembly as in claim 1, wherein an area below the three dimensional shape of the three dimensional icon is filled with a clear material.

10. The assembly as in claim 9, wherein the non-moveable switch is a capacitive touch pad located behind the three dimensional icon.

11. An assembly, comprising: a polycarbonate substrate layer;
an icon sub-assembly inserted into an opening located in the polycarbonate substrate layer, the icon sub-assembly including; a non-moveable switch, a three dimensional icon, the three dimensional icon having a forward facing surface and a rearward facing surface and a three dimensional shape molded in the rearward facing surface of the three dimensional icon and a device for illuminating the three dimensional icon; and
a layer of polyurethane applied to the polycarbonate substrate layer and the icon sub-assembly.

12. The assembly as in claim 11, wherein the non-moveable switch is formed from a clear conductor that is located on a top of the icon sub-assembly.

13. The assembly as in claim 11, wherein the non-moveable switch is a sensor ring located about a periphery of the icon sub-assembly.

14. The assembly as in claim 11, wherein the icon sub-assembly has a frame that surrounds the device for illuminating.

15. The assembly as in claim 14, wherein the frame includes a flange portion that engages a rearward facing side of the polycarbonate substrate layer about a periphery of the opening in the polycarbonate substrate layer that the icon sub-assembly is inserted into.

16. The assembly as in claim 14, wherein a flange is located between end portions of the frame and the flange engages a forward facing surface of the polycarbonate substrate layer located adjacent to the layer of polyurethane.

17. The assembly as in claim 14, wherein the frame is formed from a polycarbonate material.

18. The assembly as in claim 17, wherein the frame is opaque.

19. A method for forming an assembly, comprising:
forming a polycarbonate substrate layer with a forward facing surface and a rearward facing surface opposite to the forward facing surface;
forming a three dimensional icon within the polycarbonate substrate layer, the three dimensional icon being a three dimensional shape molded in the rearward facing surface of the polycarbonate substrate layer;
applying a layer of polyurethane to the polycarbonate substrate layer;
applying a non-moveable switch to the forward facing surface of the polycarbonate substrate layer; and
securing a device for illuminating the three dimensional icon to the polycarbonate substrate layer, wherein illumination of the three dimensional icon by the device causes the three dimensional icon to be visible on an exterior surface of the assembly.

\* \* \* \* \*